United States Patent [19]
Suzuki

[11] Patent Number: 5,841,785
[45] Date of Patent: Nov. 24, 1998

[54] MEMORY TESTING APPARATUS FOR TESTING A MEMORY HAVING A PLURALITY OF MEMORY CELL ARRAYS ARRANGED THEREIN

[75] Inventor: Masayuki Suzuki, Hanyu, Japan

[73] Assignee: Advantest Corporation, Tokyo, Japan

[21] Appl. No.: 679,761

[22] Filed: Jul. 10, 1996

[30] Foreign Application Priority Data

Jul. 12, 1995 [JP] Japan .................................. 7-175859

[51] Int. Cl.$^6$ ........................... G11C 29/00; G01R 31/28

[52] U.S. Cl. ...................... 371/21.1; 371/27.1; 371/21.2; 371/67.1; 365/201; 324/765; 324/158.1

[58] Field of Search ................................ 371/21.1, 27.1, 371/27.5, 27.6, 27.7, 21.2, 67.1, 72; 365/201, 189.02, 230.09, 230.01; 324/765, 76.11, 158.1

[56] References Cited

U.S. PATENT DOCUMENTS

| | | | |
|---|---|---|---|
| 5,392,294 | 2/1995 | Bosch et al. | 371/21.2 |
| 5,410,687 | 4/1995 | Fujisaki et al. | 365/201 |
| 5,481,671 | 1/1996 | Fujisaki | 395/182.06 |

*Primary Examiner*—Hoa T. Nguyen
*Attorney, Agent, or Firm*—Staas & Halsey

[57] ABSTRACT

Test results of a memory in which an array of memory cells in the memory is different from a bit array of data read out thereof are written in a failure analysis memory in an array close to the array of the memory cells in the memory. An address scrambler capable of arbitrarily rearranging a bit array of an address signal to be supplied to a memory under test is provided, and an altered address signal a bit array of which is altered by the address scrambler is supplied to a failure analysis memory and the pass/failure judgment results of the memory cells in the memory under test are written in the failure analysis memory at an address space thereof having a structure close to the array structure of the memory cells in the memory under test.

2 Claims, 10 Drawing Sheets

| ADDRESS SIGNALS SUPPLIED TO FAILURE ANALYSIS MEMORY ||
|---|---|
| I M | A D S           LSB |
| 0 0 | 0 0 0 0 0 0 0 0 0 |
| 0 1 | 0 0 0 0 0 0 0 0 0 |
| 1 0 | 0 0 0 0 0 0 0 0 0 |
| 1 1 | 0 0 0 0 0 0 0 0 0 |
| 0 0 | 0 0 0 0 0 0 0 0 0 |
| 0 1 | 0 0 0 0 0 0 0 0 1 |
| 1 0 | 0 0 0 0 0 0 0 0 1 |
| 1 1 | 0 0 0 0 0 0 0 0 1 |
| 0 0 | 0 0 0 0 0 0 0 1 0 |

J1 brackets the first four rows; J2 brackets the next four rows.

FIG.3

| | 13 (FAILURE ANALYSIS MEMORY) | | |
|---|---|---|---|
| | | PC (ADDRESS SIGNALS) | |
| PASS/FAILURE JUDGEMENT RESULTS | ADS | IM | |
| $C0_1$ | 0 · · · · · · 0 0 | 0 0 | |
| $C1_1$ | 0 · · · · · · 0 0 | 0 1 | |
| $C2_1$ | 0 · · · · · · 0 0 | 1 0 | |
| $C3_1$ | 0 · · · · · · 0 0 | 1 1 | |
| $C0_2$ | 0 · · · · · · 0 1 | 0 0 | |
| $C1_2$ | 0 · · · · · · 0 1 | 0 1 | |
| $C2_2$ | 0 · · · · · · 0 1 | 1 0 | |
| $C3_2$ | 0 · · · · · · 0 1 | 1 1 | |
| $C0_3$ | 0 · · · · · · 1 0 | 0 0 | |
| $C1_3$ | 0 · · · · · · 1 0 | 0 1 | |
| $C2_3$ | 0 · · · · · · 1 0 | 1 0 | |
| $C3_3$ | 0 · · · · · · 1 0 | 1 1 | |
| $C0_4$ | 0 · · · · 0 1 0 0 | 0 0 | |
| : | 0 · · · · 0 1 0 0 | 0 1 | |

Row labels at left: ADDRESS 0, 1, 2, 3, 4, ... ; LSB at right.

FIG.9

MEMORY TESTING APPARATUS FOR TESTING A MEMORY HAVING A PLURALITY OF MEMORY CELL ARRAYS ARRANGED THEREIN

BACKGROUND OF THE INVENTION

1. Field of the Invention

The present invention relates to a memory testing apparatus for use in testing a special memory such as an image memory in which an array structure of memory cells in the memory is different from an array structure of data read out of the memory.

2. Description of Related Art

FIG. 6 shows an internal structure of an example of a memory to be tested in which an array structure of memory cells in the memory is different from an array structure of bits of data read out of the memory. In the memory M shown in FIG. 6, a plurality of memory units $MU_0$–$MU_{15}$ are provided therein. Each of the memory units $MU_0$–$MU_{15}$ has arrays of memory cells $C_0$, $C_1$, $C_2$, $C_3$ and a first multiplexing circuit MUX for multiplexing a parallel data read out from these memory cell arrays $C_0$, $C_1$, $C_2$, $C_3$ into a series data provided therein. In this example, there is shown a case where a four-bit parallel data read out of the four memory cell arrays $C_0$–$C_3$ is multiplexed into a serial data by the first multiplexing circuit MUX. By this configuration, a serial signal having a speed or rate four times as fast as that of reading out of the memory cell arrays $C_0$–$C_3$ can be taken out from the output terminal of the first multiplexing circuit MUX. In the illustrated example, there is shown a memory having a plurality of, for example, sixteen memory units $MU_0$–$MU_{15}$ each having such configuration provided therein whereby a sixteen-bit high speed data can be read out from the output terminals $T_0$–$T_{15}$ of these sixteen memory units $MU_0$–$MU_{15}$, namely, from the output terminals of the memory M under test.

The first multiplexing circuit MUX can be, for example, a multiplexer. In this example, since a four-bit parallel data is selected and taken out by the multiplexer, the first multiplexing circuit MUX can be driven by a two-bit multiplexer driving signal IM. That is, a data read out from the first row of the memory cell array $C_0$ is selected and is outputted to the output terminal $T_0$ by the multiplexer driving signal IM being in the state of "0,0", a data read out from the first row of the memory cell array $C_1$ is selected and is outputted to the output terminal $T_0$ by the multiplexer driving signal IM being in the state of "0,1", a data read out from the first row of the memory cell array $C_2$ is selected and is outputted to the output terminal $T_0$ by the multiplexer driving signal IM being in the state of "1,0", and a data read out from the first row of the memory cell array $C_3$ is selected and is outputted to the output terminal $T_0$ by the multiplexer driving signal IM being in the state of "1,1". The above operation is repeated for respective rows of the memory cell arrays $C_0$–$C_3$. Therefore, the states of "0,0" to "1,1" of the multiplexer driving signal IM change at a rate four times as fast as that of an address signal ADS supplied to the memory cell arrays $C_0$–$C_3$.

FIG. 7 shows an another example of the internal structure of a memory to be tested. In this example, there is shown a memory in which a plurality of (sixteen in this example) readout data taken out from the respective first multiplexing circuits MUXs of the memory units are further multiplexed by second multiplexing circuits $PRC_1$ and $PRC_2$ in order to reduce the number of the output terminals $T_0$–$T_{15}$ of a memory M under test so that a high speed serial signal having a speed as fast as the number of times equal to the number of terminals multiplexed can be obtained. In the illustrated example, a case is shown where the readout outputs supplied to the eight output terminals $T_0$–$T_7$ of the first to the eighth memory units and the readout outputs supplied to the eight output terminals $T_8$–$T_{15}$ of the ninth to the sixteenth memory units are multiplexed by the first and second multiplexing circuits $PRC_1$ and $PRC_2$, respectively. Therefore, a readout output having a speed eight times as fast as that of the readout signal in the case shown in FIG. 6 can be obtained at the output terminals $OUT_1$ and $OUT_2$ of these second multiplexing circuits, respectively.

FIG. 8 shows an example of the circuit arrangement of a conventional memory testing apparatus. As shown, this memory testing apparatus includes a sequence controller 10 and a pattern generator 11 which operates in accordance with the control of the sequence controller 10. The pattern generator 11 outputs a test pattern signal PA to be supplied to a memory under test, an expected value pattern signal PB to be supplied to a logical comparator 12, and an address signal PC to be supplied to a failure (fail) analysis memory 13.

The test pattern signal PA includes a test pattern data and is outputted together with an address signal added thereto for specifying a memory cell location of the memory under test MUT to which the test pattern data is supplied. The test pattern data is written in the memory cell specified by the address signal and the readout output from the memory cell is compared with the expected value pattern signal PB in the logical comparator 12. If a nonconformity or disaccord occurs therebetween, the cell is determined as a failure cell and the result of comparison (a data indicating the presence of a failure cell) is stored in a failure analysis memory 13.

Further, when the result of comparison between the output read out of the memory cell and the expected value pattern signal PB is a conformity or accord, the cell is determined as a normal (pass) cell. However, this result of comparison (a data indicating the presence of a pass cell) is not stored in the failure analysis memory 13. That is, only a failure result is stored in the failure analysis memory 13.

In such a way, a pass/failure judgment result (failure judgment result in practice) of a memory under test is stored in the failure analysis memory 13. In such case, the address of the failure analysis memory 13 in which a pass/failure judgment result is written is the same as the address of the memory cell in the memory under test where the failure result has occurred. Therefore, an analysis of the failure state of the memory under test can be effected by reading out the pass/failure judgment results stored in the failure analysis memory 13.

In the case where the readout output from each of the output terminals $T_0$–$T_{15}$ of the memory M of a conventional high speed reading type is compared with the expected value pattern signal PB in the logical comparator 12 and the comparison result is stored in the failure analysis memory 13, the address signal PC supplied to the failure analysis memory 13 is the same address signal as that supplied to the memory under test MUT. Therefore, the pass/failure judgment data written in the failure analysis memory 13 is stored such that the pass/failure judgment results $C0_1$, $C1_1$, $C2_1$, $C3_1$, $C0_2$, $C1_2$, $C2_2$, $C3_2$, ... of the respective memory cells of the memory cell arrays $C_0$–$C_3$ are arranged in series and are stored in series manner. FIG. 9 shows a relation between the address signal ADS supplied to the failure analysis memory 13, the memory under test MUT, and the multiplexer driving signal IM. An address signal PC is created by adding the multiplexer driving signal IM supplied to the multiplexing circuits MUXs to the lower bit side of the address signal ADS supplied to the respective memory cell arrays $C_0$, $C_1$, $C_2$ and $C_3$ of the memory under test MUT. The multiplexer driving signal IM changes from "0,0" to "1,1" at a speed four times as fast as the speed of the address signal ADS.

As shown in FIG. 9, since the pass/failure judgment results written in the failure analysis memory 13 are arranged in an array quite irrelevant to the array of the memory cells in the memory under test MUT, it is difficult when data representing a failure is written in the failure analysis memory 13 to determine to which memory cell array in the memory under test MUT the written data belongs. That is, there is a disadvantage that a failure bit map cannot be directly depicted using the pass/failure judgment data written in the failure analysis memory 13.

On the other hand, in case that the memory under test MUT is a memory of a type explained referring to FIG. 7, since the outputs from a plurality of the output terminals $T_0$–$T_7$ and the outputs from a plurality of the output terminals $T_8$–$T_{15}$ are multiplexed respectively each time the address signal ADS supplied to the memory under test MUT changes by one address, the number of the judgment results equal to the number of multiplexed data are written in each address of the failure analysis memory 13 in the state of one being superposed on another. FIG. 10 shows this state. In FIG. 10, the row A shows an address signal PC supplied to the failure analysis memory 13. In the state in which a certain address #N of the address signal PC is supplied to the failure analysis memory 13, the data outputted to the output terminal $OUT_1$ and the data outputted to the output terminal $OUT_2$ are outputted from the pass/failure judgment results $U_0$–$U_7$ and $U_8$–$U_{15}$ respectively obtained by determining whether each of the multiplexed signals outputted from the first multiplexing circuits MUXs is a failure or pass. Therefore, a logically ORed signal of all the pass/failure judgment results $U_0$–$U_7$ of the multiplexed signal and a logically ORed signal of all the pass/failure judgment results $U_8$–$U_{15}$ of the multiplexed signal are written in the #N address of the failure analysis memory 13, and thus there is a disadvantage that the pass/failure judgment results disappear. Further, in the example shown in FIG. 10, a case is shown in which a memory is constructed such that the output terminals $T_0$–$T_7$ and $T_8$–$T_{15}$ are selected in the order of $T_0$, $T_1$, $T_2$, $T_3$, $T_7$, $T_6$, $T_5$, $T_4$, and $T_8$, $T_9$, $T_{10}$, $T_{11}$, $T_{15}$, $T_{14}$, $T_{13}$, $T_{12}$ by the second multiplexing circuits $PRC_1$ and $PRC_2$, respectively, and the outputs are taken out therefrom in the same order. This selection sequence is determined depending on the specification of a memory.

SUMMARY OF THE INVENTION

An object of the present invention is to provide a memory testing apparatus which can eliminate the above-mentioned disadvantages and can depict a failure bit map directly using the pass/failure judgment results written in the failure analysis memory.

According to one aspect of the present invention, in a memory testing apparatus for testing a memory in which an array of memory cells in the memory is different from an array of bits of data read out therefrom, an address scrambler capable of arbitrarily rearranging a bit array of an address signal to be supplied to a memory under test is provided. An address signal a bit array of which is altered by the address scrambler is supplied to a failure analysis memory and the pass/failure judgment results of the memory cells in the memory under test are written in the failure analysis memory at an address space thereof having a structure close to the array structure of the memory cells in the memory under test.

According to another aspect of the present invention, in a memory testing apparatus for testing a memory comprising a plurality of memory cell arrays arranged in the memory and a first multiplexing circuit for multiplexing a parallel signal read out of the plurality of memory cell arrays into a serial signal and for outputting the serial signal, there is provided an address scrambler receiving an address signal to be supplied to the memory cell arrays and a multiplexer driving signal to be supplied to the first multiplexing circuit and for generating an altered address signal in which the multiplexer driving signal supplied to the multiplexing circuit is added to the higher bit side of the address signal supplied to the memory cell arrays. A failure analysis memory is accessed by the altered address signal and the pass/failure judgment results of the cells of each of the memory cell arrays are separately written in corresponding one of storage areas in the failure analysis memory partitioned by the multiplexer driving signal.

In accordance with the present invention thus constructed, even in case of testing a memory of the type that a parallel data read out of a plurality of memory cell arrays is converted into a serial data which is outputted, the pass/failure judgment results to be written in the failure analysis memory can be classified and stored in the corresponding storage areas prepared one for one memory cell array. Therefore, in case a failure judgment result of a cell is written in a memory cell of the failure analysis memory, it is possible to determine to which memory cell array the failure cell belongs from the storage area of the failure analysis memory in which the failure result has been written. In other words, a failure bit map can directly be depicted. Therefore, there is an advantage that a failure analysis can easily be performed.

According to further aspect of the present invention, in a memory testing apparatus for testing a memory comprising a plurality of memory units each of which comprises a plurality of memory cell arrays arranged in said memory and a first multiplexing circuit for multiplexing a parallel data read out of the plurality of memory cell arrays into a serial data and for outputting the serial data, and a second multiplexing circuit for multiplexing a plurality of serial data read out of the plurality of memory units into a multiplexed data and for outputting the multiplexed data, there is provided an address scrambler for generating an altered address signal having a bit structure in which a first multiplexer driving signal to be supplied to said first multiplexing circuit is added to the higher bit side of an address signal supplied to said memory cell arrays and a bit position data to be supplied to said second multiplexing circuit is further added to the higher bit side of said first multiplexer driving signal. The altered address signal generated from the address scrambler is supplied to a failure analysis memory to access the memory.

By accessing the failure analysis memory using such altered address signal, the failure analysis memory has a plurality of storage areas prepared one for one output terminal by the bit position data signal and each of these storage areas is further partitioned into a plurality of storage sections prepared one for one memory cell array by the first multiplexer driving signal. Therefore, the pass/failure judgment results of respective memory cells in each of the memory cell arrays are written in corresponding one of the memory sections prepared one for each memory cell array.

BRIEF DESCRIPTION OF THE DRAWINGS

FIG. 3 is an illustration for explaining the operation of the first operation mode of FIG. 2;

FIG. 9 is an illustration for explaining an array of pass/failure judgment results written in a failure analysis memory of the conventional memory testing apparatus shown in FIG. 8.

DESCRIPTION OF THE PREFERRED EMBODIMENT

Now, an embodiment of the present invention will be described in detail with reference to the accompanying drawings.

Figure 1:
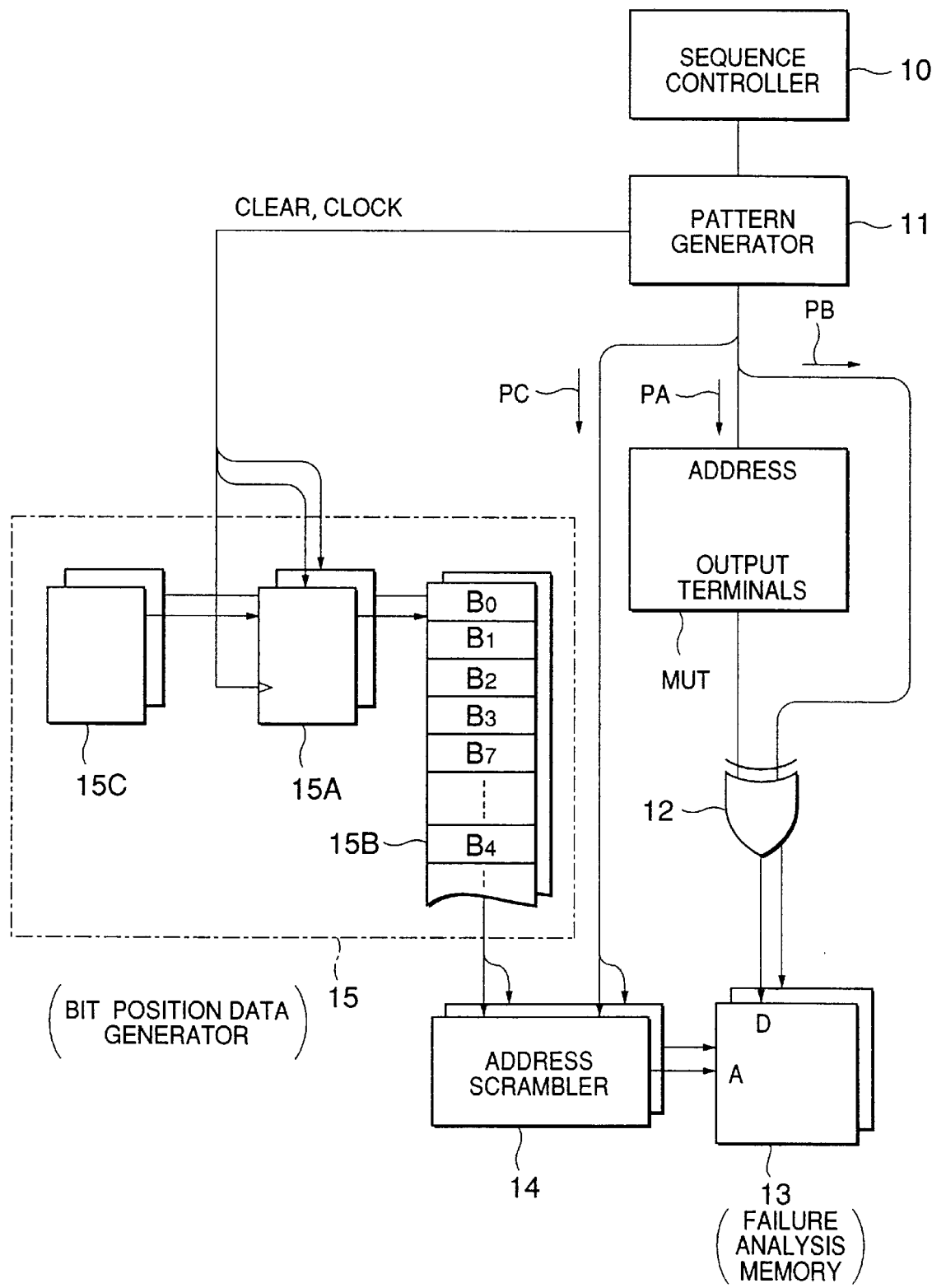
FIG. 1 is a block diagram showing an embodiment of a memory testing apparatus according to the present invention.
Figure 8:
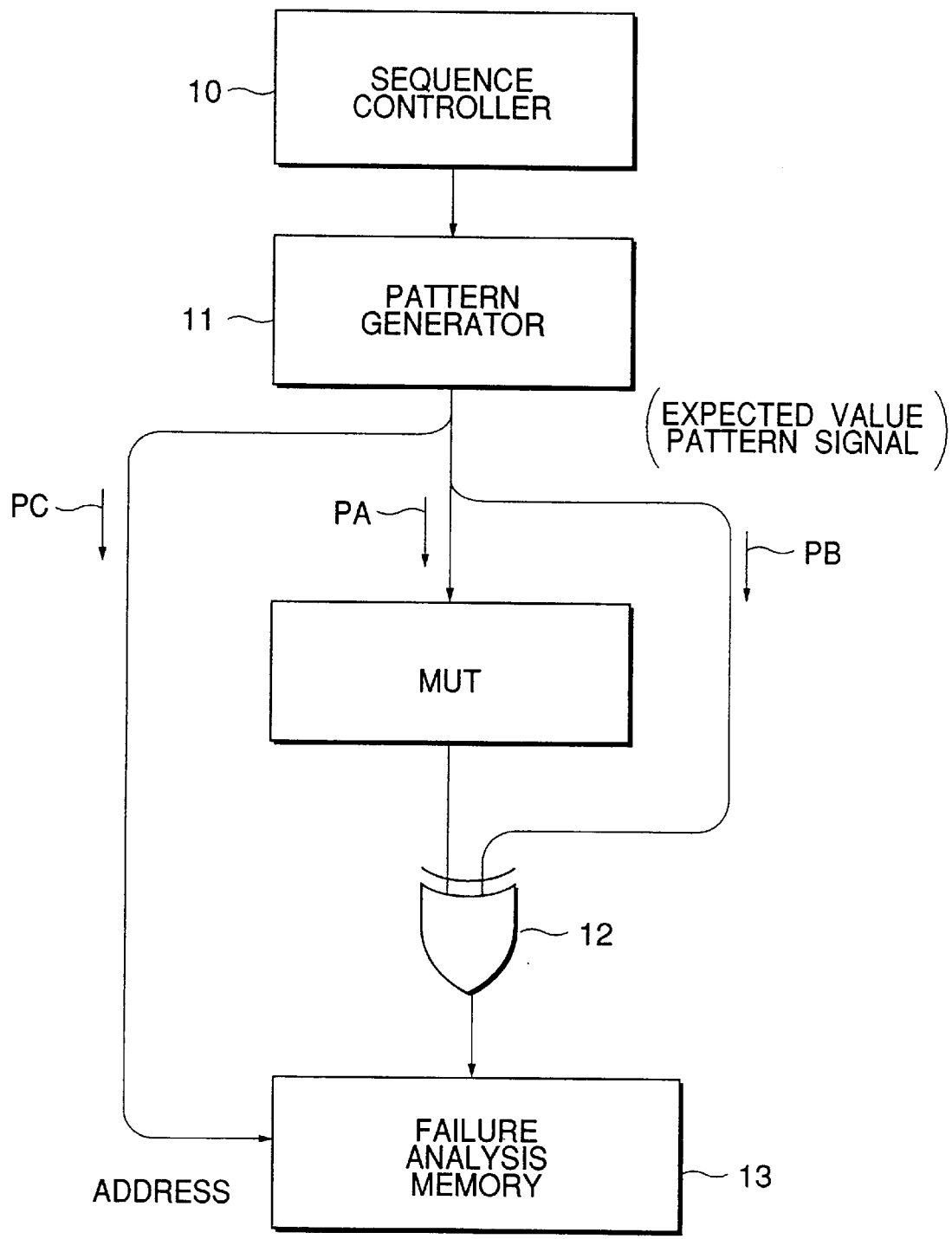
FIG. 8 is a block diagram for explaining a simplified construction of a conventional memory testing apparatus.
Figure 10:
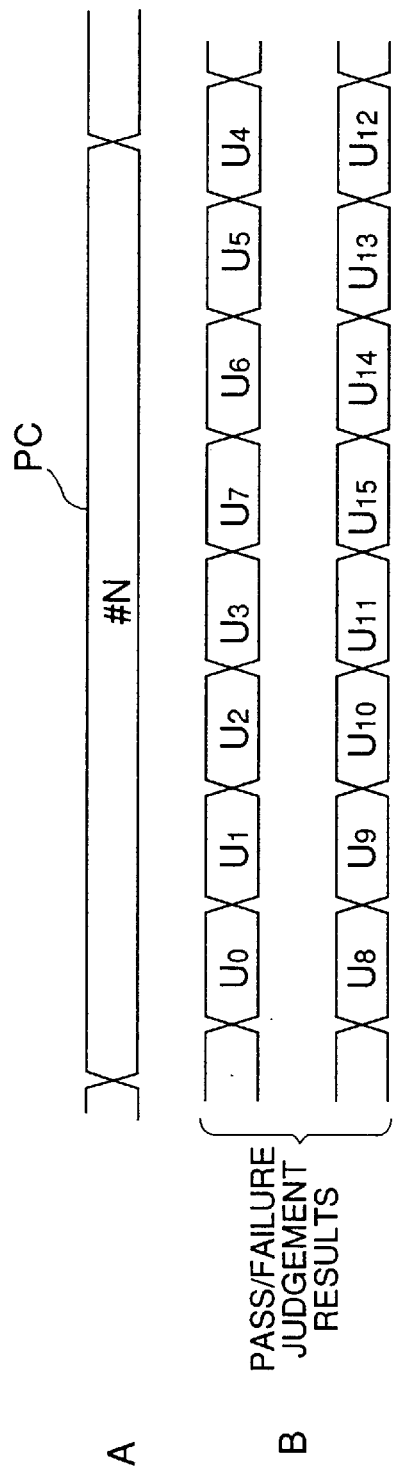
FIG. 10 is waveforms for explaining a disadvantage occurring when a memory having a structure shown in FIG. 7 is tested by a conventional memory testing apparatus.

FIG. 1 is a block diagram showing the construction of an embodiment of a memory testing apparatus according to the present invention. The portions corresponding to those in FIG. 8 are indicated by the same reference characters affixed. In the present invention, an address signal PC for a failure analysis memory outputted from a pattern generator 11 is supplied to an address scrambler 14 where an array of bits of an address signal to be supplied to the failure analysis memory 13 is changed in accordance with the internal structure of a memory under test MUT.

Figure 2:
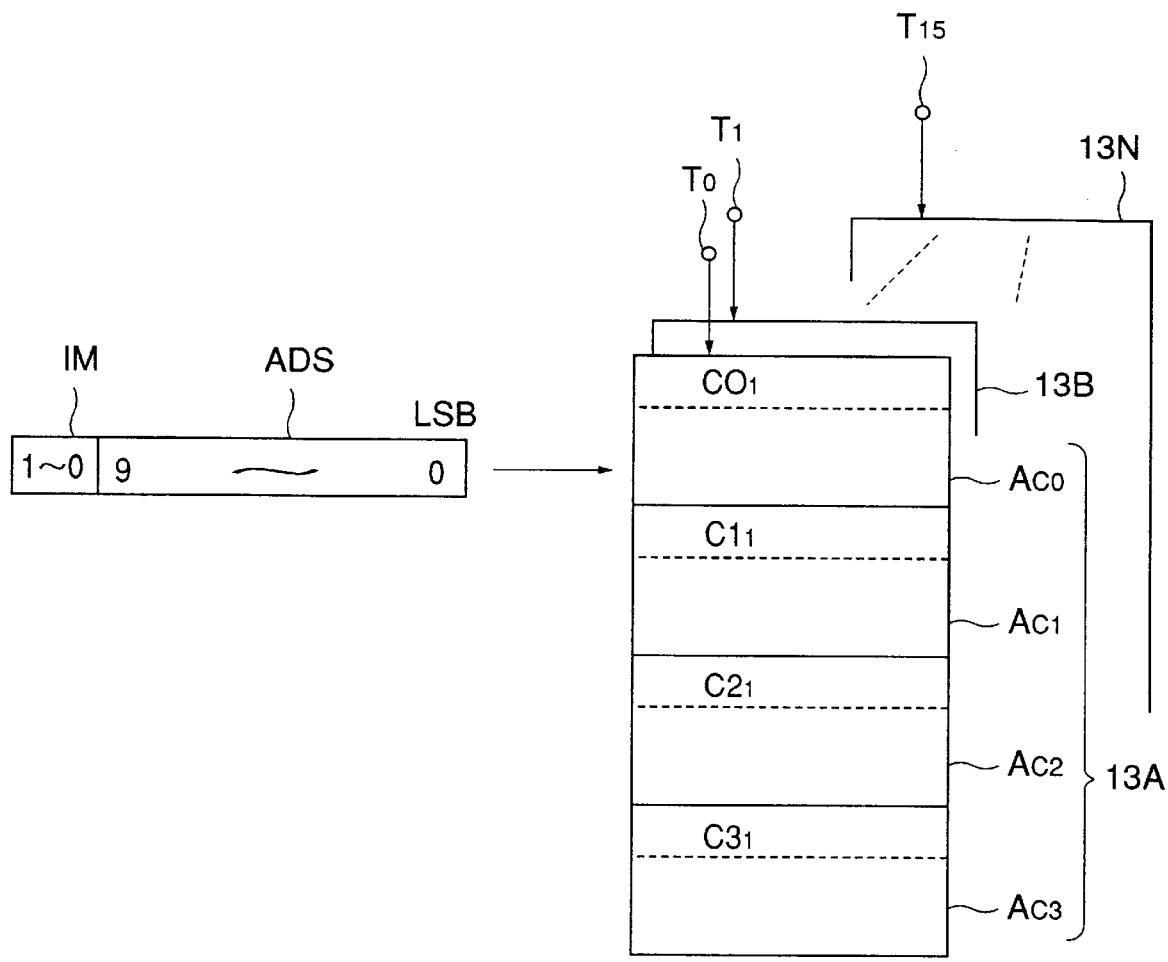
FIG. 2 is an illustration for explaining a first operation mode of the memory testing apparatus according to the present invention.
Figure 6:
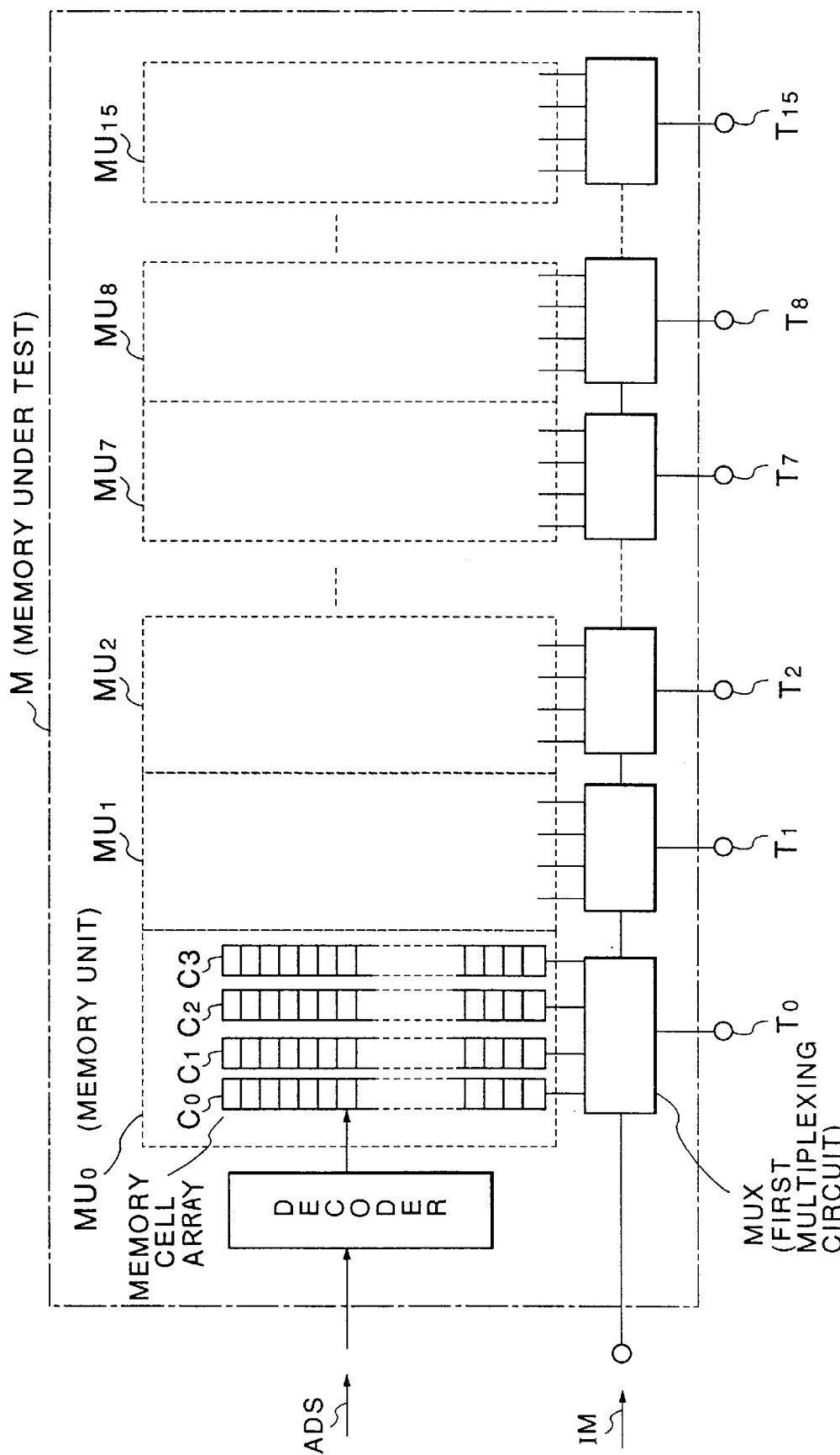
FIG. 6 is a block diagram for explaining a structure of a memory under test.

First, a case in which a memory having a structure shown in FIG. 6 is tested will be explained. FIG. 2 illustrates a relation between a bit array of the address signal supplied to the failure analysis memory 13 and storage areas provided in the failure analysis memory 13 in this case. In FIG. 2, ADS is an address signal supplied to the memory cell arrays $C_0$–$C_3$ of the memory under test MUT. An altered address signal in which the multiplexer driving signal IM supplied to the first multiplexing circuits MUXs is positioned at the higher bit side (the higher side of the most significant bit) of the address signal ADS is supplied to the failure analysis memory 13 as an address signal. In this altered address signal the first multiplexer driving signal IM of two bits in this example is positioned at the higher bit side of the address signal ADS for reading out the memory cell arrays $C_0$–$C_3$, and hence four storage areas $A_{C0}$, $A_{C1}$, $A_{C2}$ and $A_{C3}$ determined by the number of bits of the first multiplexer driving signal IM are provided in the failure analysis memory 13.

As is apparent from FIG. 3, in the first cycle J1 in which the first multiplexer driving signal IM changes from "0,0" to "1,1", the address signal ADS points to address 0.

Therefore, pass/failure judgment results $C0_1$, $C1_1$, $C2_1$ and $C3_1$ of the memory cells each having address "0" of the four memory cell arrays $C_0$–$C_3$ are classified into the corresponding storage areas $A_{C0}$, $A_{C1}$, $A_{C2}$ and $A_{C3}$ of the failure analysis memory 13 shown in FIG. 2 and are written in the addresses "0" in the respective storage areas $A_{C0}$–$A_{C3}$ of the failure analysis memory 13, respectively. In the second cycle J2, pass/failure judgment results $C0_2$, $C1_2$, $C2_2$ and $C3_2$ of the memory cells each having address "1" of the four memory cell arrays $C_0$–$C_3$ are classified into the corresponding storage areas $A_{C0}$, $A_{C1}$, $A_{C2}$ and $A_{C3}$ of the failure analysis memory 13 and are written in the addresses "1" in the respective storage areas $A_{C0}$–$A_{C3}$, respectively. Similarly, pass/failure judgment results $C0_{N+1}$, $C1_{N+1}$, $C2_{N+1}$ and $C3_{N+1}$ of the memory cells each having address "N" of the four memory cell arrays $C_0$–$C_3$ are classified into the corresponding storage areas $A_{C0}$, $A_{C1}$, $A_{C2}$ and $A_{C3}$ of the failure analysis memory 13 and are written in the addresses "N" in the respective storage areas $A_{C0}$–$A_{C3}$, respectively.

By such a classification of the pass/failure judgment results as described above, the pass/failure judgment results of the respective memory cells of the memory cell array $C_0$ are written in the storage area $A_{C0}$ in order of address, the pass/failure judgment results of the respective memory cells of the memory cell array $C_1$ are written in the storage area $A_{C1}$ in order of address, and the pass/failure judgment results of the respective memory cells of the memory cell array $C_2$ are written in the storage area $A_{C2}$ in order of address.

Therefore, by classifying the respective storage areas $A_{C0}$–$A_{C3}$ and depicting a failure bit map separately for each storage area, it is possible to directly look in the face to which memory cell array a failure memory cell belongs. Further, the failure analysis memory 13 is constituted such that it has a plurality of memory blocks 13A, 13B, ... 13N (N=16 in this example) the number of which corresponds to the number (sixteen) of the output terminals $T_0$–$T_{15}$ shown in FIG. 6, and the results of comparison and judgment of each of the signals outputted from the respective output terminals $T_0$–$T_{15}$ and the expected value pattern signal are written in the corresponding memory blocks 13A–13N, respectively.

Figure 4:
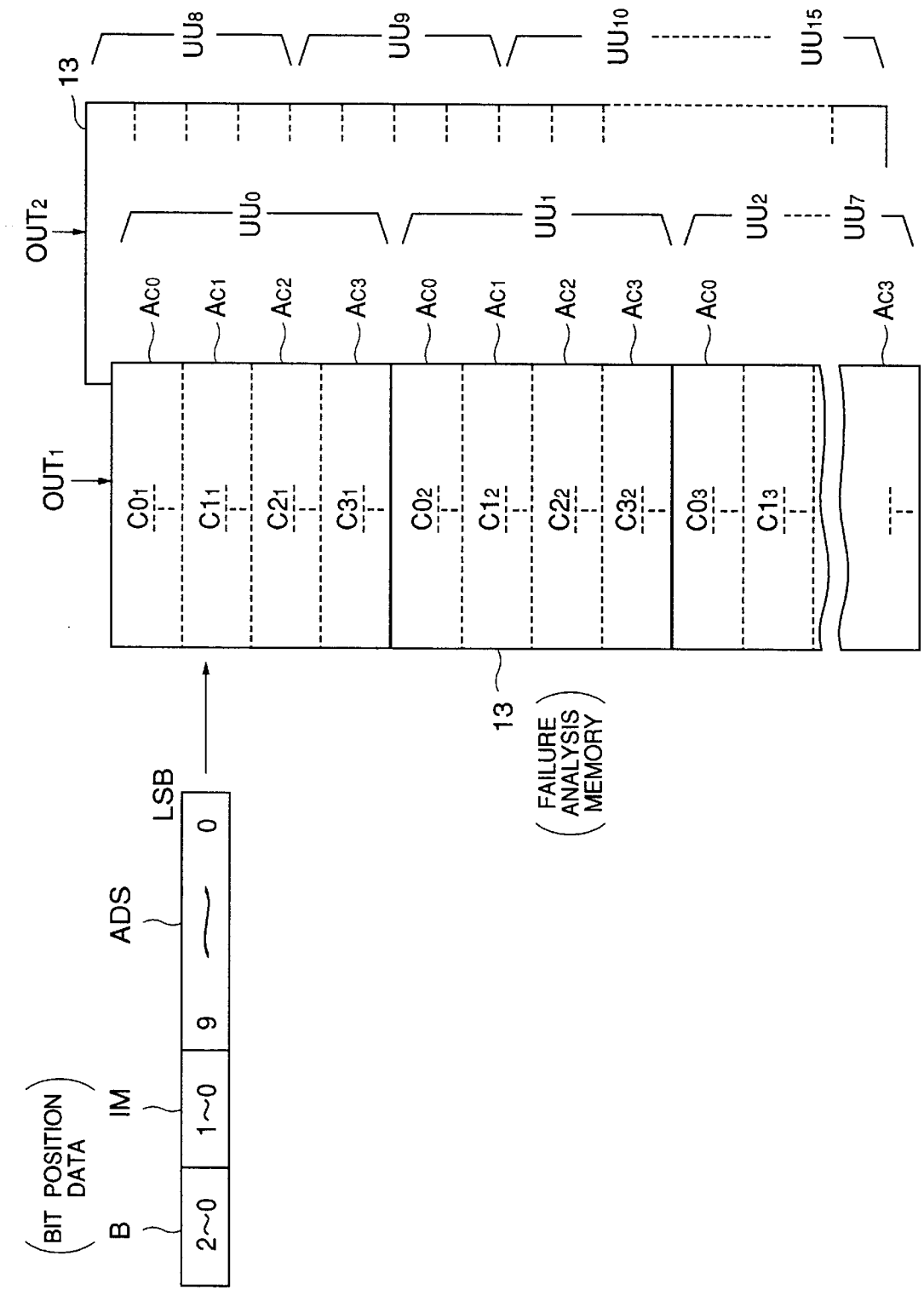
FIG. 4 is an illustration for explaining a second operation mode of the memory testing apparatus according to the present invention.
Figure 7:
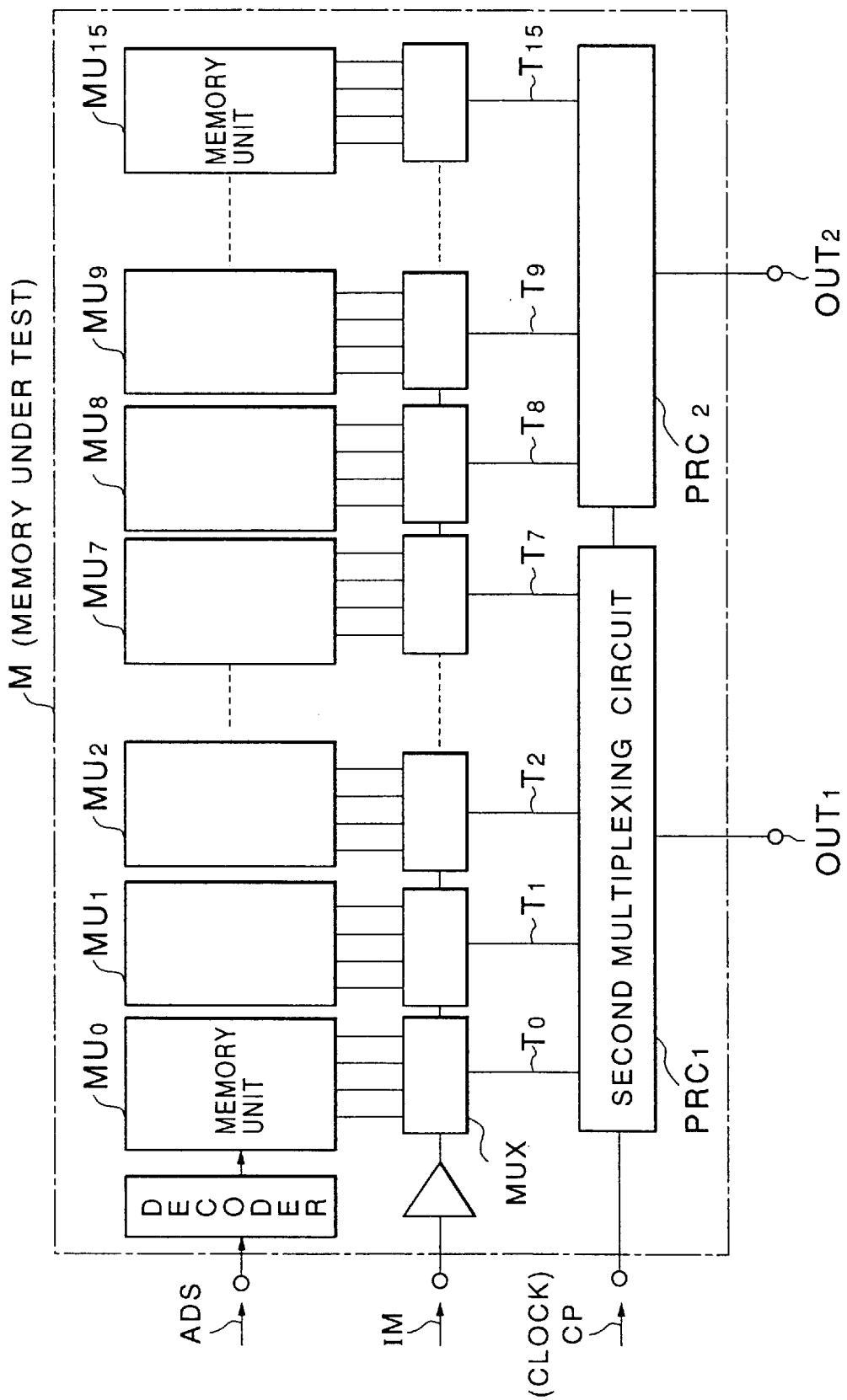
FIG. 7 is a block diagram for explaining another structure of a memory under test.

FIG. 4 illustrates a relation between a bit structure or array of the address signal supplied to the failure analysis memory 13 and storage areas provided in the failure analysis memory 13 in case of testing a memory having a structure shown in FIG. 7. In this case, an altered address signal having a bit structure is supplied to the failure analysis memory 13, the bit structure of the altered address signal being such that the multiplexer driving signal IM supplied to the first multiplexing circuits MUXs is positioned at the higher bit side (the higher side of the most significant bit) of the address signal ADS and further a bit position data B ($B_0$–$B_7$, $B_8$–$B_{15}$) for driving the second multiplexing circuits $PRC_1$ and $PRC_2$ is positioned at the higher bit side of the first multiplexer driving signal IM.

Since it suffices in this example that the bit position data $B_0$–$B_7$ and $B_8$–$B_{15}$ for driving the second multiplexing circuits can identify bit positions of the signals outputted from eight of the first multiplexing circuits MUXs and from the remaining eight of the first multiplexing circuits MUXs, respectively, the bit position data B can be sufficiently expressed by a signal of three bits (2–0).

Figure 5:
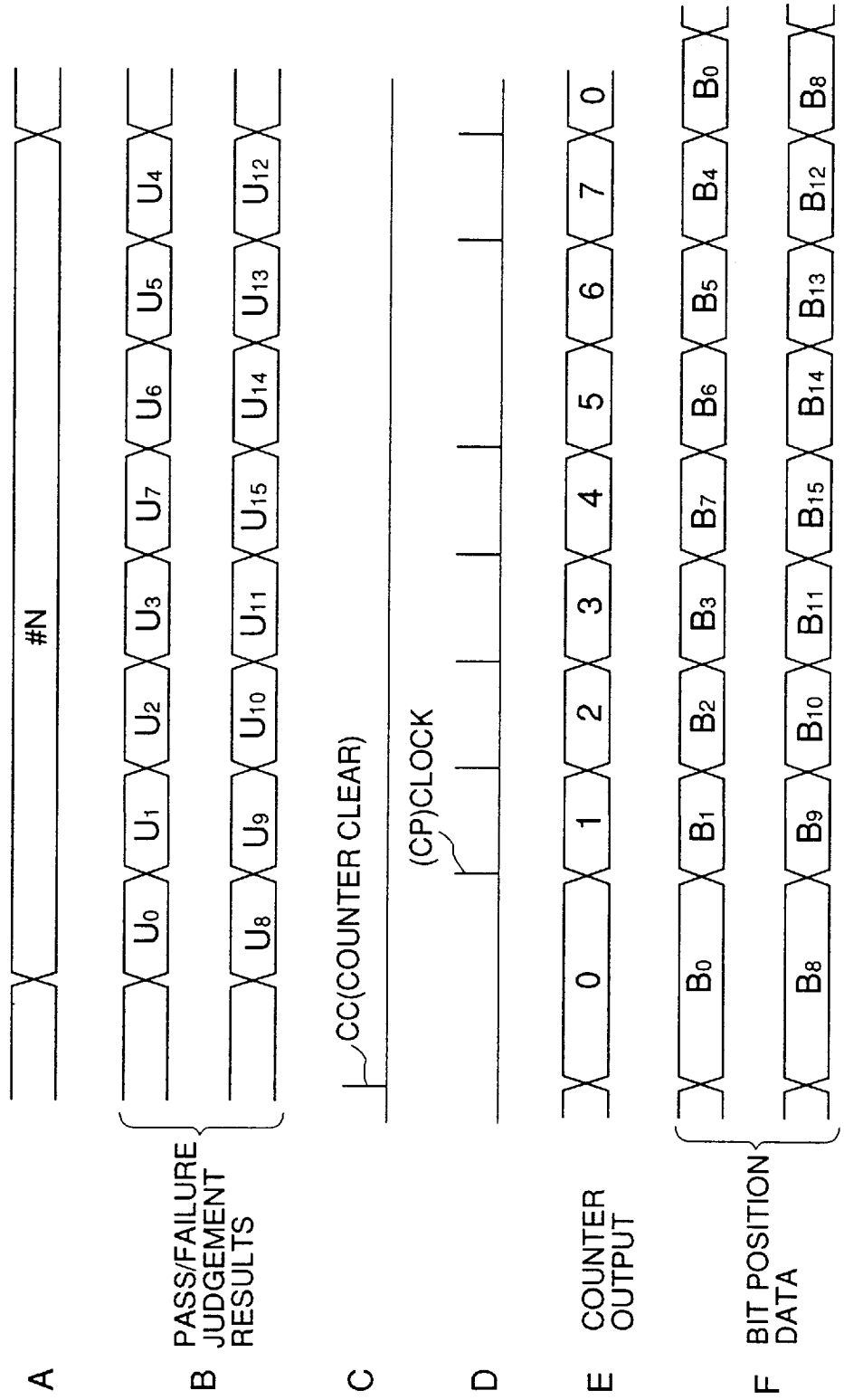
FIG. 5 shows waveforms for explaining the operation of the second operation mode of FIG. 4.

This bit position data B is generated by a bit position data generator 15 shown in FIG. 1. The bit position data generator 15A receives a counter clear signal CC shown in FIG. 5, row C and a clock CP shown in FIG. 5, row D from the pattern generator 11 and generates bit position data B (FIG. 5, row F) in synchronism with the clock CP. To this end, the bit position data generator 15 comprises a counter 15A for counting the clock CP, a serial sequence memory 15B from which the bit position data $B_0$–$B_7$ and $B_8$–$B_{15}$ written in the respective addresses thereof are outputted by the count value of this counter 15A supplied to the respective addresses as an address signal, and a serial bit register 15C.

Two systems each comprising the counter 15A, the serial sequence memory 15B and the serial bit register 15C are provided in this example, and the bit position data $B_0$–$B_7$ are outputted from the serial sequence memory of one system and the bit position data $B_8$–$B_{15}$ are outputted from the serial sequence memory of the other system. Each of the serial bit registers 15C stores the least significant bit position and the most significant bit position of each system. Therefore, bit positions $B_0$ and $B_7$ are stored in the serial bit register of one system and bit positions $B_8$ and $B_{15}$ are stored in the serial bit register of the other system. Based on the stored contents of the serial bit registers 15C, the two counters 15A repeat the counting of count values from 0 to 7 and count values from 8 to 15, respectively.

In the second multiplexing circuits $PRC_1$ and $PRC_2$ provided in the memory under test MUT, bit positions are multiplexed in order of $B_0$, $B_1$, $B_2$, $B_3$, $B_7$, $B_6$, $B_5$, $B_4$ and in order of $B_8$, $B_9$, $B_{10}$, $B_{11}$ $B_{15}$, $B_{14}$, $B_{13}$, $B_{12}$, in this example. Therefore, the bit position data are also written in the serial sequence memories 15B of two systems in the same order as in multiplexing (in order of $B_0$, $B_1$, $B_2$, $B_3$, $B_7$, $B_6$, $B_5$, $B_4$ and in order of $B_8$, $B_9$, $B_{10}$, $B_{11}$, $B_{15}$, $B_{14}$, $B_{13}$, $B_{12}$).

Therefore, each time the counter 15A counts eight clocks CP, the serial sequence memory 15B of one system outputs the bit position data in order of $B_0$, $B_1$, $B_2$, $B_3$, $B_7$, . . . $B_4$ and the serial sequence memory 15B of the other system outputs the bit position data in order of $B_8$, $B_9$, $B_{10}$, $B_{11}$, $B_{15}$, . . . $B_{12}$.

By adding the bit position data $B_0$–$B_7$ and $B_8$–$B_{15}$ to the higher bit side of the first multiplexer driving signal IM, the pass/failure judgment results of the respective memory units $MU_0$–$MU_{15}$ are classified into the corresponding storage areas $UU_0$–$UU_7$ and $UU_8$–$UU_{15}$ shown in FIG. 4 which are partitioned by the bit position data $B_0$–$B7$ and $B_8$–$B_{15}$, and are written therein, respectively. The inside of each of the storage areas $UU_0$–$UU_7$ and $UU_8$–$UU_{15}$ is further partitioned into, in this example, four sections $A_{C0}$–$A_{C3}$ by the first multiplexer driving signal IM and the comparison and judgment results of the respective memory cell arrays $C_0$–$C_3$ are written in these sections $A_{C0}$–$A_{C3}$, respectively.

Therefore, in this case, the pass/failure judgment results of the memory cells of the respective memory cell arrays $C_0$–$C_3$ in the memory under test MUT are also classified into the corresponding storage areas $A_{C0}$–$A_{C3}$ of the failure analysis memory 13, respectively, and are stored therein, and further, the pass/failure judgment results of each of the memory units $MU_0$–$MU_{15}$ are separately stored in the failure analysis memory 13 from one another. Accordingly, a failure bit map can be easily depicted using the pass/failure judgment results stored in this failure analysis memory 13.

As is apparent from the foregoing, according to the present invention, even the case of testing a memory in which an array of memory cells in the memory is different from an array of bits of data read out therefrom, the pass/failure judgment results stored in the failure analysis memory 13 are written in the memory in an array close to the array of the memory cells in the memory. Therefore, a memory unit or a memory cell array to which a failure cell belongs can immediately be identified or specified by the pass/failure judgment results written in the failure analysis memory 13. In addition, by depicting a failure bit map, in which memory cell array a failure has occurred or the like can be detected from the depicted map at once.

Furthermore, as shown in FIG. 1, since the serial sequence memories 15B are provided in the bit position data generator 15, even if bit positions of data outputted in a multiplexed form from the memory under test MUT are arranged, for example, in order of $B_0$, $B_1$, $B_2$, $B_3$, $B_7$, $B_6$, $B_5$, $B_4$ as described above, the data can be classified correspondingly to the array of bit positions and written in respective storage areas $UU_0$–$UU_7$ and $UU_8$–$UU_{15}$. Accordingly, there is an advantage that even if the specification of the memory under test MUT is modified or changed to any other specification, the memory under test MUT can be tested corresponding to the modified specification.

What is claimed is:

1. A memory testing apparatus for testing a memory, said memory comprising a plurality of memory cell arrays arranged in said memory and a first multiplexing circuit multiplexing a parallel signal read out of the plurality of memory cell arrays into a serial signal and outputting the serial signal, said memory cell arrays comprising memory cells, said memory testing apparatus comprising:

pattern generator means for generating at least a test pattern signal to be applied to said memory, an address signal, and an expected value signal;

means for generating a multiplexer driving signal and supplying the multiplexer driving signal to the first multiplexing circuit;

a comparator receiving the expected value signal from the pattern generator means and the serial signal from the memory, and comparing the serial signal to the expected value signal;

a failure analysis memory storing a pass/failure judgment result based on the comparison of the serial signal and the expected value signal, said pass/failure judgement result indicating a failed memory cell of the memory cells in said memory at an address specified by the address signal supplied from said pattern generator means, said failure analysis memory comprising a plurality of storage areas therein, a number of which is equal to that of bits of the multiplexer driving signal to be supplied to said first multiplexing circuit of said memory;

an address scrambler receiving the address signal to be supplied to said memory cell arrays of said memory output from said pattern generator means, and the multiplexer driving signal to be supplied to said first multiplexing circuit of said memory, and generating an altered address signal in which said multiplexer driving signal supplied to said first multiplexing circuit is added to higher-order bits of said address signal supplied to said memory cell arrays; and means for accessing said failure analysis memory using said altered address signal and for writing the pass/failure judgment results corresponding to each of the memory cells of each of the memory cell arrays at a corresponding one of said storage areas in said failure analysis memory partitioned by said multiplexer driving signal.

2. A memory testing apparatus for testing a memory, said memory comprising a plurality of memory units each of which comprises a plurality of memory cell arrays arranged in said memory, a first multiplexing circuit multiplexing parallel data read out of said plurality of memory cell arrays into serial data and outputting the serial data, and a second multiplexing circuit multiplexing a plurality of serial data read out of said plurality of memory units into multiplexed data and outputting the multiplexed data, each of said memory cell arrays comprising memory cells, said memory testing apparatus comprising:

- pattern generating means for generating at least a test pattern signal to be applied to said memory, an address signal, and an expected value signal;
- means for generating a first multiplexer driving signal and supplying the first multiplexer driving signal to the first multiplexing circuit;
- a comparator receiving the expected value signal from the pattern generator means and the serial signal from the memory, and comparing the serial signal to the expected value signal;
- a failure analysis memory storing a pass/failure judgment result based on the comparison of the serial signal and the expected value signal, said pass/failure judgement result indicating a failed memory cell of the memory cells in said memory at an address specified by the address signal supplied from said pattern generator means, said failure analysis memory comprising a plurality of storage areas therein, the number of which is equal to that of bits of the first multiplexer driving signal to be supplied to said first multiplexing circuit of said memory;
- bit position data generator means for receiving a counter clear signal and a clock signal from said pattern generator means and generating bit position data in synchronism with the clock signal, said bit position data generator means comprising:
  - a counter counting the clock signal,
  - a serial sequence memory storing therein bit position data at respective addresses thereof and outputting the bit position data, on receiving the count value of said counter as an address signal, from the address thereof specified by the count value, and
  - a serial bit register;
- an address scrambler receiving the address signal to be supplied to said memory cell arrays of said memory output from said pattern generator means, a first multiplexing driving signal to be supplied to said first multiplexing circuit of said memory, and bit position data from said serial bit register of said bit position data generator means, and generating an altered address signal having a bit structure in which the first multiplexer driving signal to be supplied to said first multiplexing circuit of said memory is added to the higher-order bits of the address signal supplied to said memory cell arrays and the bit position data to be supplied to said second multiplexing circuit of said memory is further added to the higher-order bits of said first multiplexer driving signal; and
- means for accessing said failure analysis memory using said altered address signal and for writing the pass/failure judgment results corresponding to each of the memory cells of each of the memory cell arrays at a corresponding one of said storage areas in said failure analysis memory partitioned by said multiplexer driving signal.

* * * * *